US010615481B2

(12) United States Patent
Kuwabara

(10) Patent No.: US 10,615,481 B2
(45) Date of Patent: Apr. 7, 2020

(54) MILLIMETER WAVE SEMICONDUCTOR APPARATUS INCLUDING A MICROSTRIP TO FIN LINE INTERFACE TO A WAVEGUIDE MEMBER

(71) Applicant: NEC CORPORATION, Tokyo (JP)

(72) Inventor: Toshihide Kuwabara, Tokyo (JP)

(73) Assignee: NEC CORPORATION, Minato-ku, Tokyo (JP)

( * ) Notice: Subject to any disclaimer, the term of this patent is extended or adjusted under 35 U.S.C. 154(b) by 0 days.

(21) Appl. No.: 15/753,998

(22) PCT Filed: Aug. 18, 2016

(86) PCT No.: PCT/JP2016/003760
§ 371 (c)(1),
(2) Date: Feb. 21, 2018

(87) PCT Pub. No.: WO2017/033436
PCT Pub. Date: Mar. 2, 2017

(65) Prior Publication Data
US 2018/0254229 A1 Sep. 6, 2018

(30) Foreign Application Priority Data

Aug. 24, 2015 (JP) .................................. 2015-164742

(51) Int. Cl.
*H01P 5/107* (2006.01)
*H01L 23/66* (2006.01)
(Continued)

(52) U.S. Cl.
CPC .............. *H01P 5/107* (2013.01); *H01L 23/14* (2013.01); *H01L 23/66* (2013.01); *H01L 24/00* (2013.01);
(Continued)

(58) Field of Classification Search
CPC ...................................................... H01P 5/107
(Continued)

(56) References Cited

U.S. PATENT DOCUMENTS 4,636,753 A * 1/1987 Geller et al. ............ H01P 5/107
333/238
8,536,954 B2 * 9/2013 Leiba et al. ............ H01L 23/66
333/247
(Continued)

FOREIGN PATENT DOCUMENTS

JP 09-246801 A 9/1997
JP 2001-085912 A 3/2001
(Continued)

OTHER PUBLICATIONS

Written Opinion for PCT/JP2016/003760, dated Nov. 8, 2016.
International Search Report for PCT/JP2016/003760, dated Nov. 8, 2016.

*Primary Examiner* — Benny T Lee
(74) *Attorney, Agent, or Firm* — Sughrue Mion, PLLC

(57) ABSTRACT

A millimeter wave semiconductor apparatus includes: a module substrate including the millimeter wave semiconductor chip mounted thereon; and a waveguide tube member constituting a package of the chip and the waveguide tube by including the waveguide tube and supporting the module substrate, the module substrate includes: a base member; a line pattern including a microstrip line portion, a fin line portion, and an interface portion formed on one of surfaces of the base member; a ground pattern formed on the other surface of the base member; and a cavity defined by a hole formed through the base member at a center portion thereof and a surface of the ground pattern on a side where the line pattern is formed as a bottom surface for mounting the chip
(Continued)

on the bottom surface thereof, and the microstrip line portion and the chip are wire-bonded at the substantially same level.

5 Claims, 14 Drawing Sheets

(51) Int. Cl.
*H01P 1/02* (2006.01)
*H01L 23/14* (2006.01)
*H01L 23/00* (2006.01)

(52) U.S. Cl.
CPC ............... *H01P 1/02* (2013.01); *H01L 24/48* (2013.01); *H01L 2223/6611* (2013.01); *H01L 2223/6627* (2013.01); *H01L 2223/6683* (2013.01); *H01L 2224/32245* (2013.01); *H01L 2224/48091* (2013.01); *H01L 2224/48227* (2013.01); *H01L 2224/73265* (2013.01); *H01L 2924/1423* (2013.01); *H01L 2924/15153* (2013.01); *H01L 2924/16152* (2013.01); *H01L 2924/16251* (2013.01)

(58) Field of Classification Search
USPC .......................................................... 333/26
See application file for complete search history.

(56) References Cited

U.S. PATENT DOCUMENTS

2007/0229186 A1* 10/2007 Hacker et al. ........ H01P 5/1007
333/125
2014/0285383 A1* 9/2014 Fakharzadeh et al. .....................
H01P 5/107
343/702

FOREIGN PATENT DOCUMENTS

JP 2002-368561 A 12/2002
WO 2015/107588 A1 7/2015

* cited by examiner

MILLIMETER WAVE SEMICONDUCTOR APPARATUS INCLUDING A MICROSTRIP TO FIN LINE INTERFACE TO A WAVEGUIDE MEMBER

CROSS REFERENCE TO RELATED APPLICATIONS

This application is a National Stage of International Application No. PCT/JP2016/003760 filed Aug. 18, 2016, claiming priority based on Japanese Patent Application No. 2015-164742 filed Aug. 24, 2015.

TECHNICAL FIELD

The present invention relates to a millimeter wave semiconductor apparatus.

BACKGROUND ART

In packaging of a semiconductor operating at very high frequencies such as millimeter waves (hereinafter, referred to as a millimeter wave semiconductor chip), how to realize an interface for an RF signal is an important issue.

In other words, even though an electrode drawing structure or a soldered structure employed in packaging of a normal semiconductor integrated circuit is applied to packaging of the millimeter wave semiconductor chip, desired characteristics may not be stably obtained due to significant degradation of a signal intensity of the RF signal.

In an electric/electronic apparatus using millimeter waves, a waveguide tube is often used as an RF interface with respect to passive components such as filters and antennas which require strict performances.

Accordingly, when packaging the millimeter wave semiconductor chip, a configuration of the RF interface that is similar to the waveguide tube is considered to be effective.

When the wave guide tube is employed as the RF interface of the millimeter wave semiconductor chip, the RF interface is assumed to be connected to a microstrip line, a coplanar line, or the like, and thus provision of a connection mechanism for the microstrip line portion and the coplanar line with respect to the waveguide tube may be required in the package.

When considering an application for millimeter waves such as a fixed communication equipment for frequency bands referred to as a V-band (60 GHz) and an E-band (70/80 GHz), a broad frequency band may be used, and thus high-speed communication is advantageously achieved. Therefore, when realizing the millimeter wave semiconductor apparatus, it is desired to provide the RF interface with broadband frequency characteristics.

In order to do so, realization of broadband characteristics without loss is required in connection between the microstrip line portion and the waveguide tube and, in addition, these members are required to be compact enough to be accommodated in the package and to be manufactured at low costs.

FIG. 13 is a drawing illustrating an example of a connection between a microstrip line portion 101 and a waveguide tube 102 on a ceramic substrate.

In this connection structure, a distal end (probe) 104 of the microstrip line portion 101 is inserted into the waveguide tube 102 in an open-state.

One of surfaces of the waveguide tube 102 corresponds to a short-circuit surface 103, and transmission characteristics are determined depending on a shape of the probe 104 and dimensions such as a distance between the probe 104 and the short-circuit surface 103.

Therefore, when manufacture with high degree of accuracy in dimension or the like is achieved, comparatively broadband characteristics are achieved. However, it is difficult to assemble such a structure into the package.

In JP 2001-85912 A (i.e designated as PTL1 below), a waveguide as illustrated in FIG. 14 is proposed. The waveguide described above has a configuration in which a microstrip line 110 formed on a printed substrate 113 is coupled to a slot 111 formed on a ground surface side of the microstrip line 110, and the slot 111 and a waveguide tube 112 are connected.

A technology disclosed in PTL2 (listed below) is also one of technologies in the related art.

CITATION LIST

Patent Literature

[PTL1]: JP 2001-85912 A
[PTL2]: WO 2015/107588

SUMMARY OF THE INVENTION

Technical Problem

However, although a configuration disclosed in JP 2001-85912 A is similar to the printed substrate 113 and the like and thus seems to allow easy packaging, it is difficult to provide broadband frequency characteristics.

Accordingly, it is a principal object of the present invention to provide a millimeter wave semiconductor apparatus having reduced loss of an RF signal in a broadband arrangement.

Solution to the Problem

In order to solve the above-described problem, the present invention provides a packaged millimeter wave semiconductor apparatus including a millimeter wave semiconductor chip and a waveguide tube configured to guide an RF signal entering and exiting the millimeter wave semiconductor chip, the apparatus including: a module substrate including the millimeter wave semiconductor chip mounted thereon; and a waveguide tube including the waveguide tube formed thereon, supporting the module substrate, and constituting a package of the millimeter wave semiconductor chip and the waveguide tube, wherein the module substrate includes: a base member; a line pattern including a microstrip line portion, a fin line portion, and an interface portion formed on one of surfaces of the base member; a ground pattern formed on the other surface of the base member; and a cavity defined by a hole formed through the base member at a center portion thereof and a surface of the ground pattern on a side where the line pattern is formed as a bottom surface for mounting the millimeter wave semiconductor chip on the bottom surface thereof, wherein the microstrip line portion and the millimeter wave semiconductor chip are wire-bonded at the substantially same level.

Advantageous Effects of the Invention

According to the present invention, a millimeter wave semiconductor apparatus having reduced loss of an RF signal in a broadband may be provided.

DETAILED DESCRIPTION OF THE EMBODIMENTS

Figure 1:
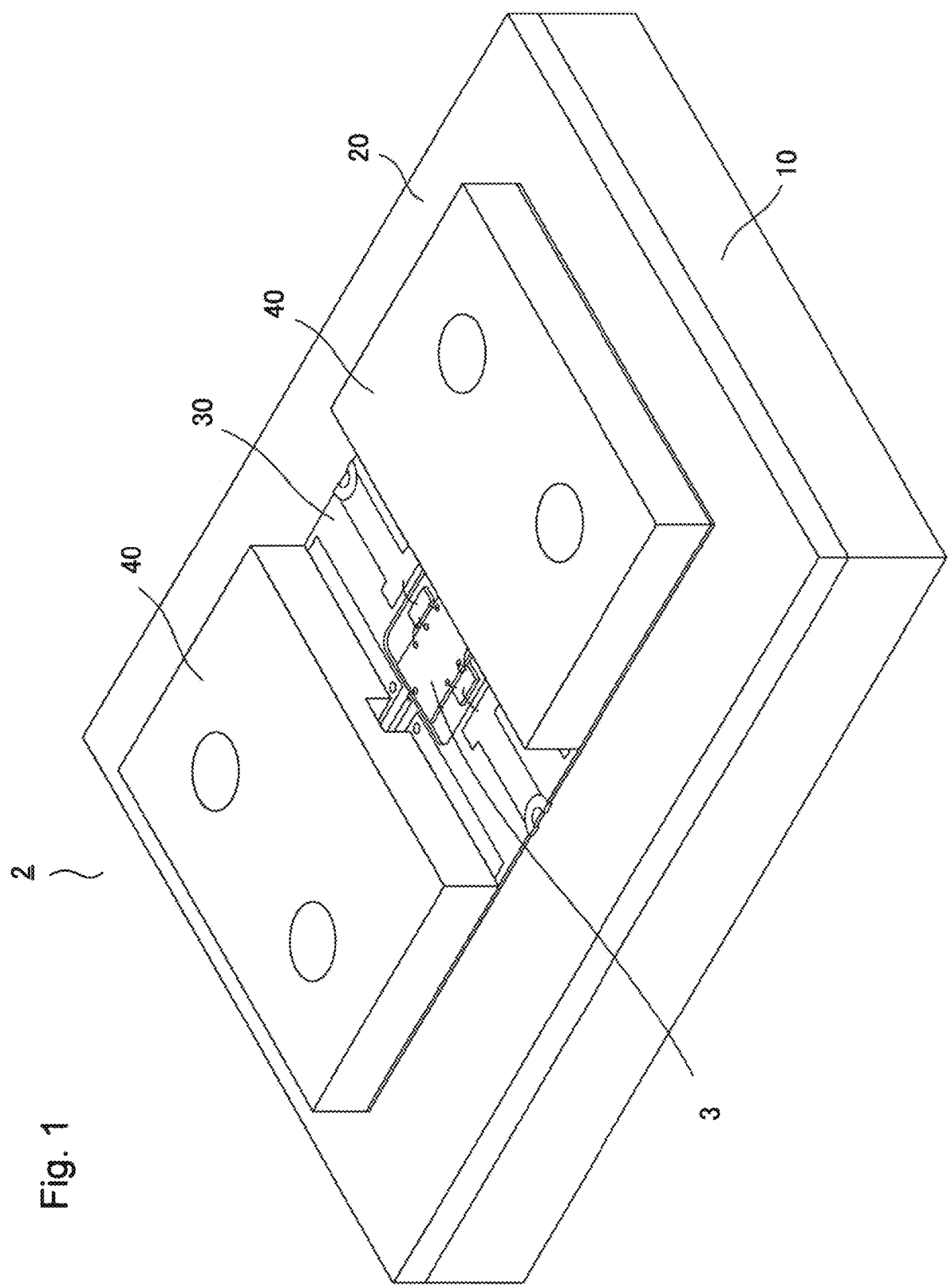
FIG. 1 is a perspective view of a millimeter wave semiconductor apparatus according to an exemplary embodiment.
Figure 2:
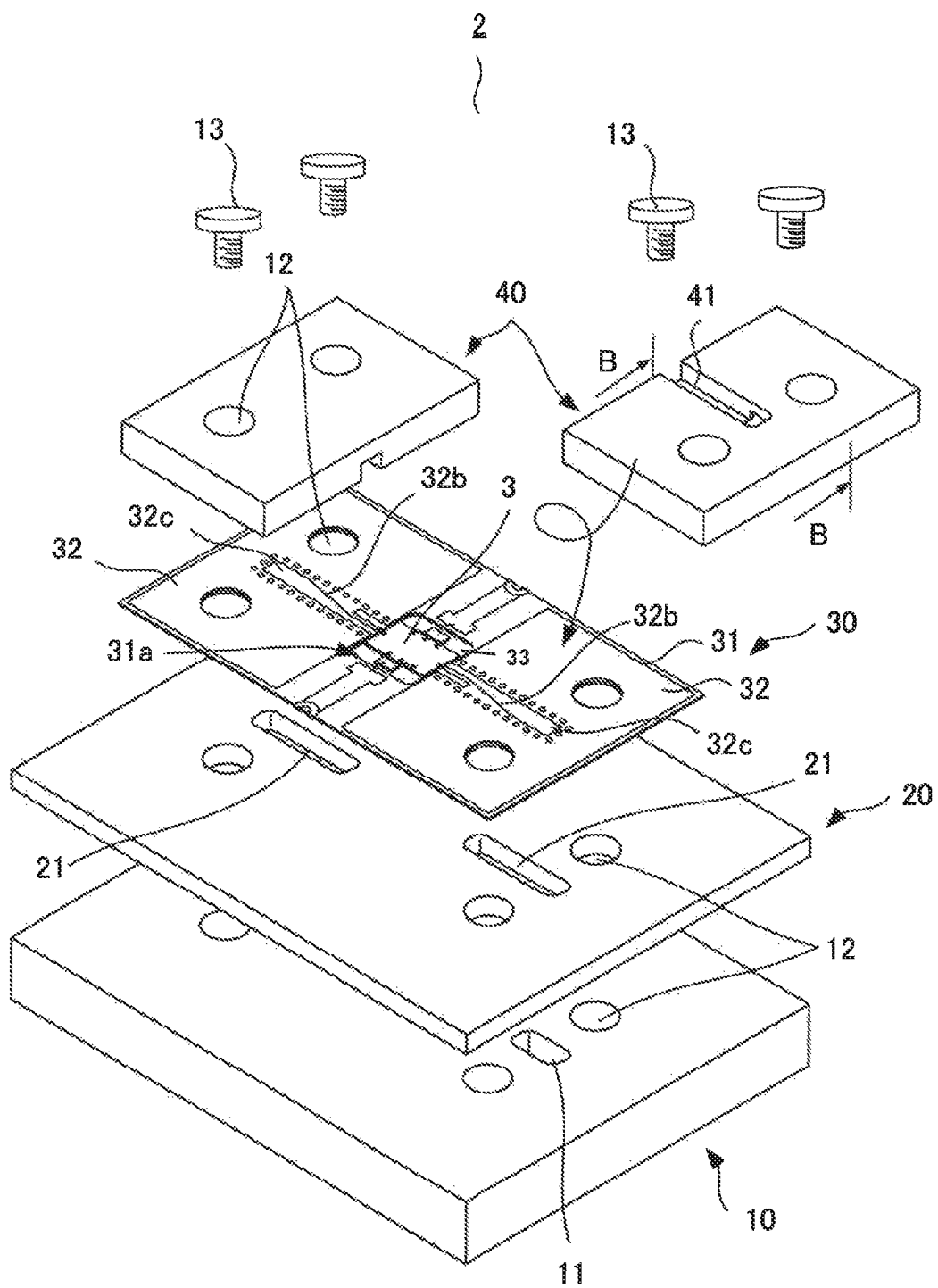
FIG. 2 is an assembly drawing of the millimeter wave semiconductor apparatus.

An exemplary embodiment of the present invention will be described. FIG. 1 is a perspective view of a millimeter wave semiconductor apparatus 2 according to the exemplary embodiment. FIG. 2 is an assembly drawing of the millimeter wave semiconductor apparatus 2.

The millimeter wave semiconductor apparatus 2 is principally includes a conductor case 10 also in (FIG. 7), a mounting substrate 20 fixed to the conductor case 10, a module substrate 30 also in (FIG. 5) including the millimeter wave semiconductor chip 3 mounted thereon and the mounting substrate 20 also in (FIG. 7) mounted thereon, and a conductor cover 40 also in (FIG. 6 and FIG. 7) to be mounted on the module substrate 30.

As illustrated in FIG. 2, the conductor case 10 is a plate-shaped member, and includes a waveguide tube window 11 having an elongated circular shape in cross section and penetrating therethrough in a plate-thickness direction. The conductor case 10 is provided with through holes 12 also in (FIGS. 3, 4, and 12) at four corners thereof. The through holes 12 are also formed through the mounting substrate 20, the module substrate 30, and the conductor cover 40, and screws 13 are inserted through these through hole 12, so that the millimeter wave semiconductor apparatus 2 is assembled.

The mounting substrate 20 includes a waveguide 21 also in (FIG. 7) formed at positions opposing the waveguide tube window 11 of the conductor case 10. Note that the waveguide tube window 11 and the waveguide 21, having an elongated circular shape in cross section taken along a surface of a plate such as the mounting substrate 20, are not limited to the elongated circular shape, and may have a rectangular shape. Although two of the waveguide tube windows 11 and two of the waveguides 21 are illustrated in FIG. 2, a remark that such illustration is not intended to limit the number of the members is added here.

The module substrate 30 includes a base member 31 formed of an organic dielectric, a line pattern 32 also in (FIG. 7) provided on one (hereinafter, referred to as an upper surface) of the surfaces of the base member 31 also in (FIG. 7), and a ground pattern 33 also in (FIG. 2, FIG. 3, FIG. 5 and FIG. 7) on the other surface (hereinafter, referred to as a lower surface).

Figure 3:
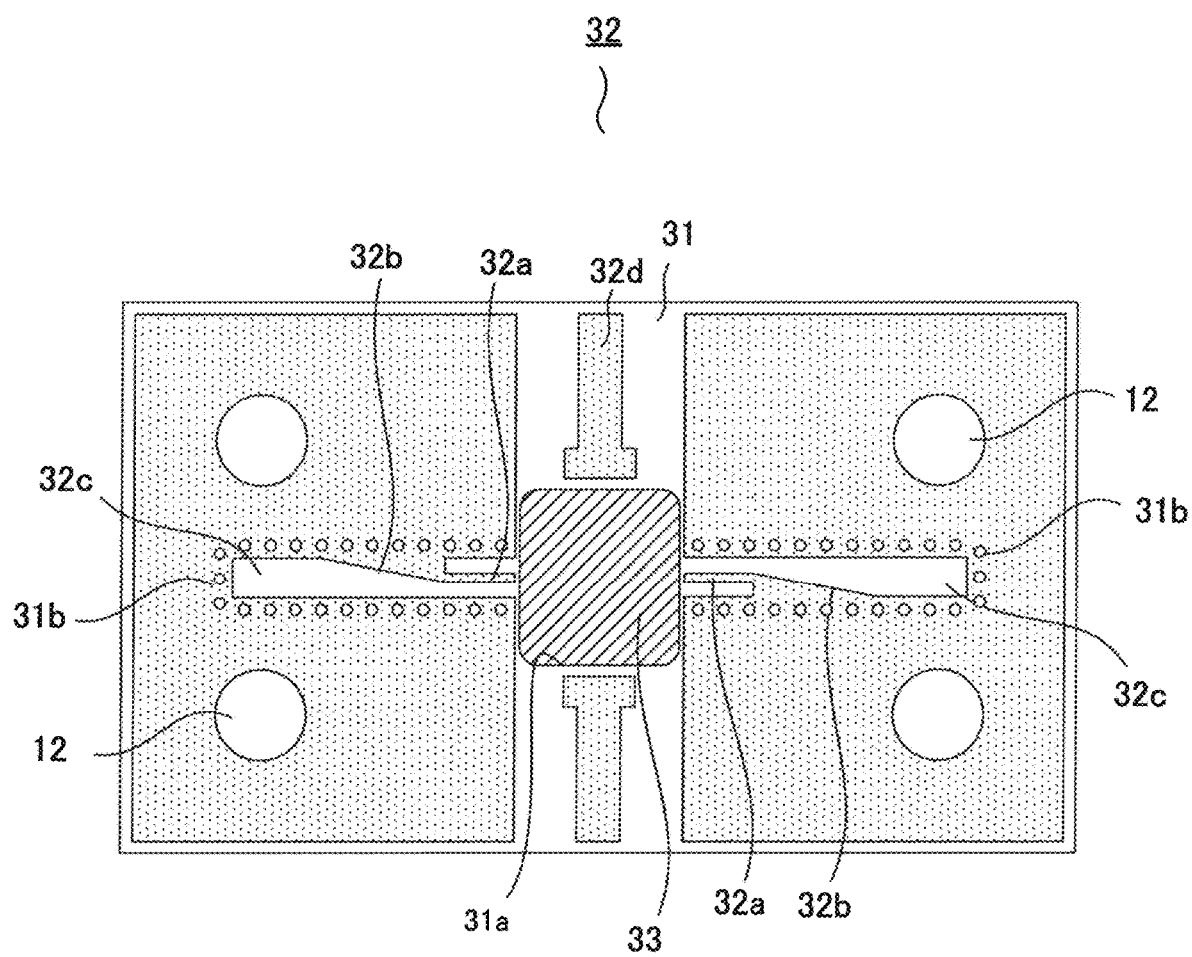
FIG. 3 is a drawing illustrating a line pattern.
Figure 4:
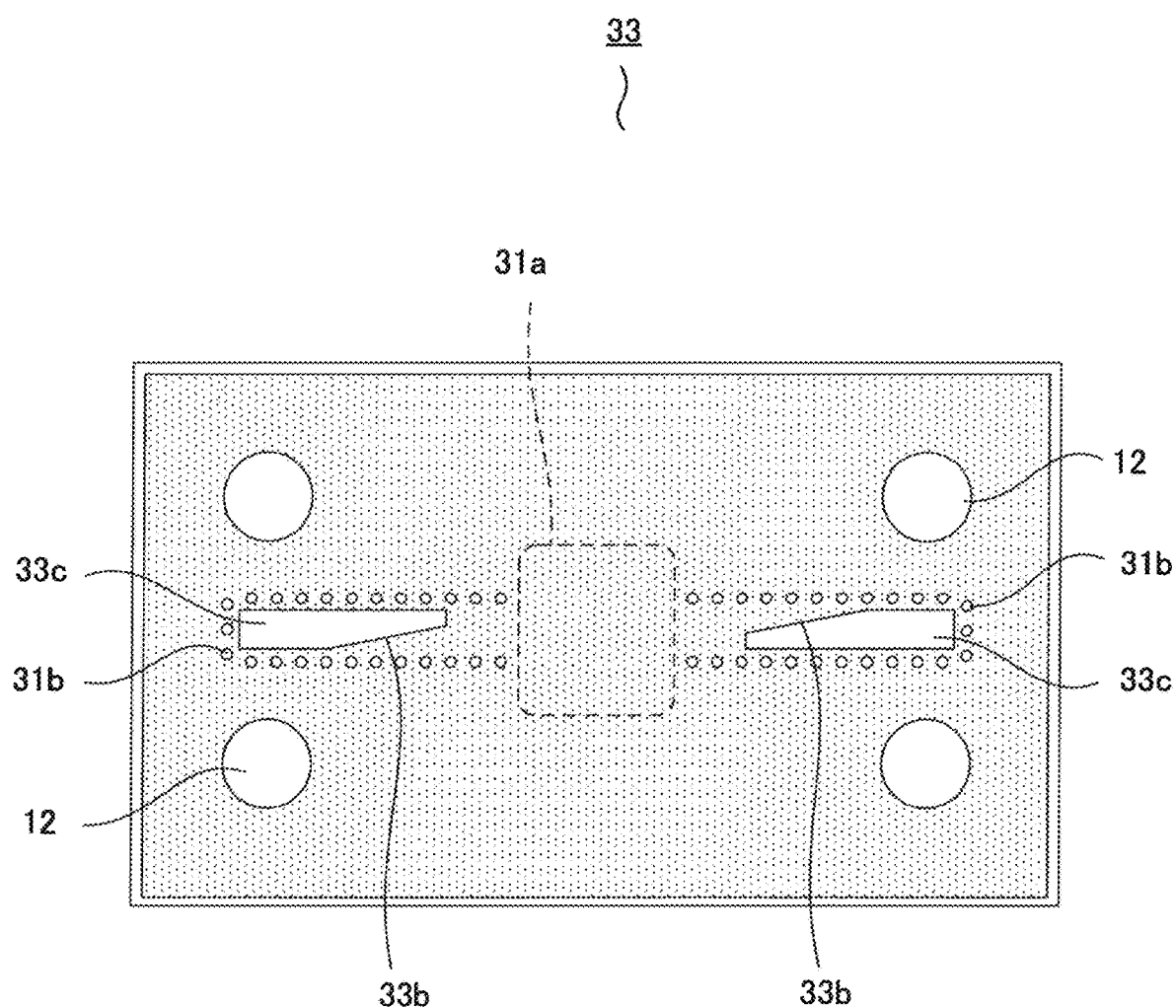
FIG. 4 is a drawing illustrating a ground pattern.

FIG. 3 is a drawing illustrating the line pattern 32. FIG. 4 is a drawing illustrating the ground pattern 33. Note that dot areas in FIG. 3 and FIG. 4 indicate remaining patterns.

As illustrated in FIG. 3, the base member 31 includes a substantially rectangular-shaped cavity 31a also in (FIG. 2 and FIG. 9) formed by cutting a center portion, and a plurality of through holes 31b also in (FIG. 4 and FIG. 7) for connecting the line pattern 32 and the ground pattern 33.

The cavity 31a accommodates a millimeter wave semiconductor chip 3. The millimeter wave semiconductor chip 3 also in FIG. 1, FIG. 2 and FIG. 9 accommodated in the cavity 31a is disposed in electrical connection with the ground pattern 33. A hatched area in FIG. 3 corresponds to the ground pattern 33.

The line pattern 32 includes microstrip line portions 32a also in (FIG. 7), tapered fin line portions 32b also in (FIG. 2, FIG. 7, and FIG. 9), interface portions 32c also in (FIG. 2, FIG. 7, and FIG. 9) formed on both sides (left and right in FIG. 3) of the cavity 31a, and DC terminal portions 32d.

Likewise, as illustrated in FIG. 4, the ground pattern 33 includes tapered fin line portions 33b also in (FIG. 7 and FIG. 9) and interface portions 33c also in (FIG. 4, FIG. 7, and FIG. 9) on both sides (left and right in FIG. 4) of the cavity 31a.

The ground pattern 33 is formed by patterning a copper foil having a film thickness of, for example, 0.25 mm. In this manner, by having the thick ground pattern 33, cutting accuracy for formation of the cavity 31a by a cutting process may be alleviated. In other words, the cavity 31a may be formed inexpensively and easily.

Since the ground pattern 33 is thick, even when excessive cutting to some extent occurs, an intensity required for supporting the millimeter wave semiconductor chip 3 also in FIG. 1 and FIG. 2 may be secured. As a matter of course, as the ground pattern 33 is formed of a metal such as copper, heat generating in the millimeter wave semiconductor chip 3 may be dissipated advantageously quickly correspondingly to its increased thickness.

Figure 5:
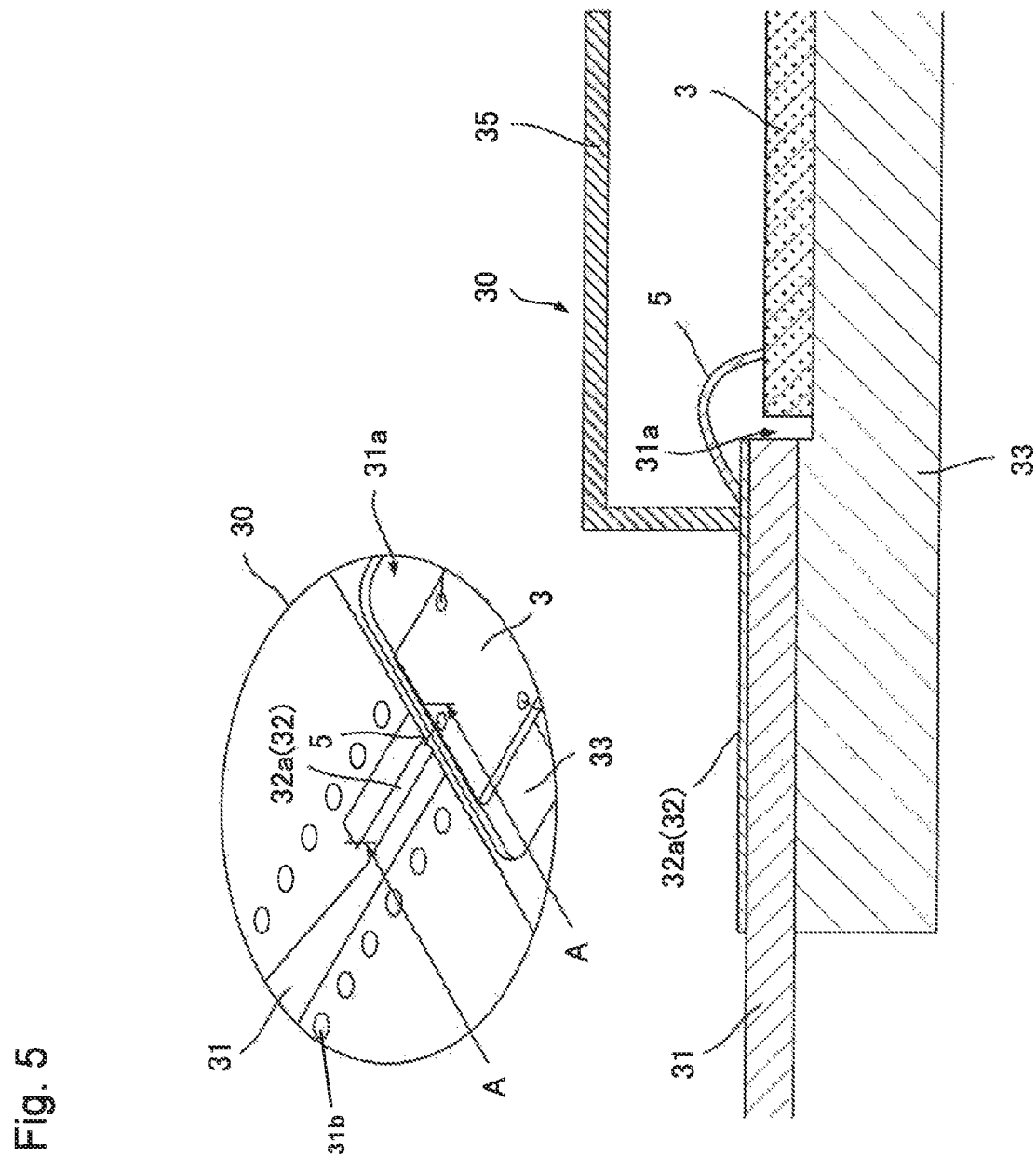
FIG. 5 is a drawing illustrating a positional relationship in height among a millimeter wave semiconductor chip, the line pattern, and the ground pattern.

FIG. 5 is a drawing illustrating a positional relationship in height among the millimeter wave semiconductor chip 3 accommodated in the cavity 31a, the line pattern 32, and the ground pattern 33 in cross section viewed in a direction indicated by arrows A-A in a drawing of the module substrate 30 on an upper left of the same drawing. The millimeter wave semiconductor chip 3 is accommodated in the cavity 31a, and is electrically connected to the ground pattern 33 via conductive post or the like. The millimeter wave semiconductor chip 3 is bonded to the microstrip line portion 32a of the line pattern 32 by a metallic wire 5.

Figure 7:
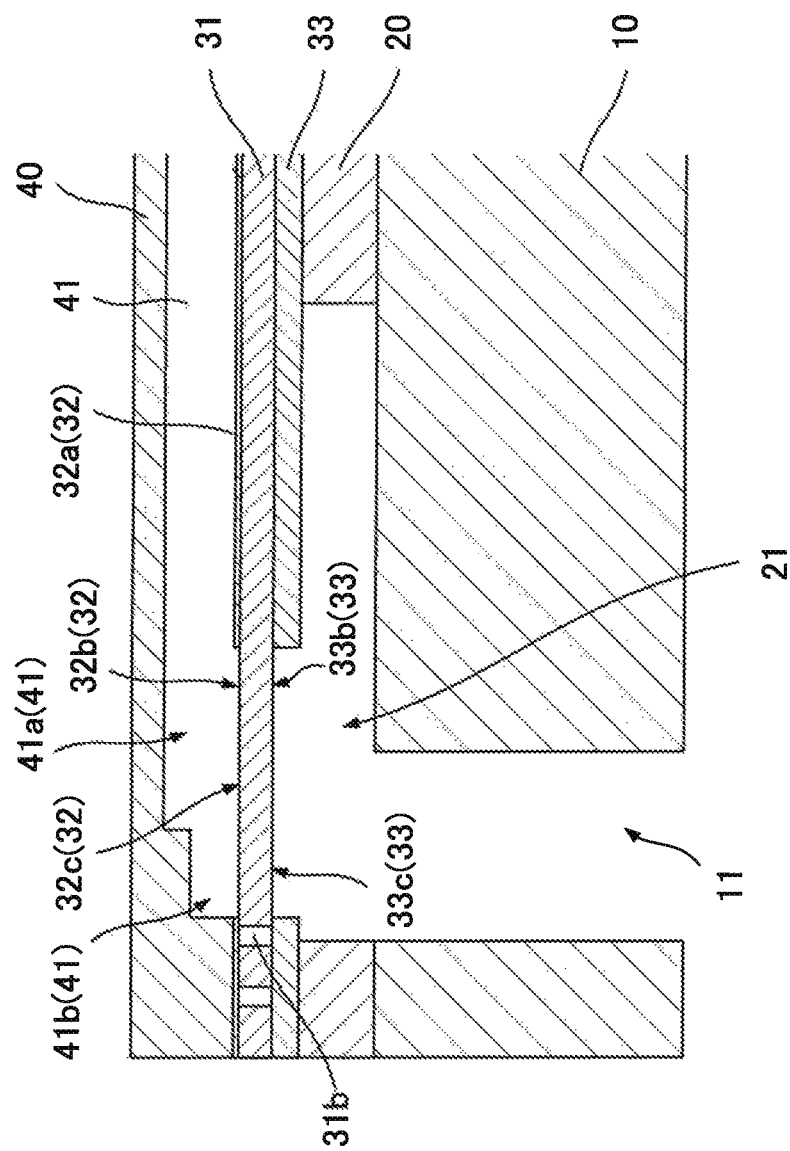
FIG. 7 is a partial cross-sectional view of the millimeter wave semiconductor apparatus.

Note that the entire or a part of line pattern 32 is electrically connected to the ground pattern 33 via the through holes 31b also in (FIG. 3, FIG. 4, and FIG. 7). Therefore, when the frequency is low, electric characteristics will not be changed even when the millimeter wave semiconductor chip 3 is mounted without forming the cavity 31a.

However, when the millimeter wave semiconductor chip 3 is formed on the base member 31 having the line pattern 32 formed thereon without forming the cavity 31a, there arises a difference in height between the millimeter wave semiconductor chip 3 and the microstrip line portion 32a. An impedance caused by this difference in height may result in an occurrence of a significant signal loss in an RF signal having a very high frequency.

In other words, the reason why the significant signal loss occurs seems to be an increased length of the line due to the difference in height. Therefore, in a configuration of the exemplary embodiment in which the difference between the millimeter wave semiconductor chip 3 and the microstrip line portion 32a in height is reduced by forming the cavity 31a, the signal loss may be reduced as descried with reference to FIG. 11 and so forth later.

Note that the millimeter wave semiconductor chip 3 may be covered by a mold material covering on the millimeter wave semiconductor chip 3 disposed in the cavity 31a from above. In the cross section in FIG. 5, a case where the cavity 31a is covered by a mold material 35 is illustrated.

Figure 6:
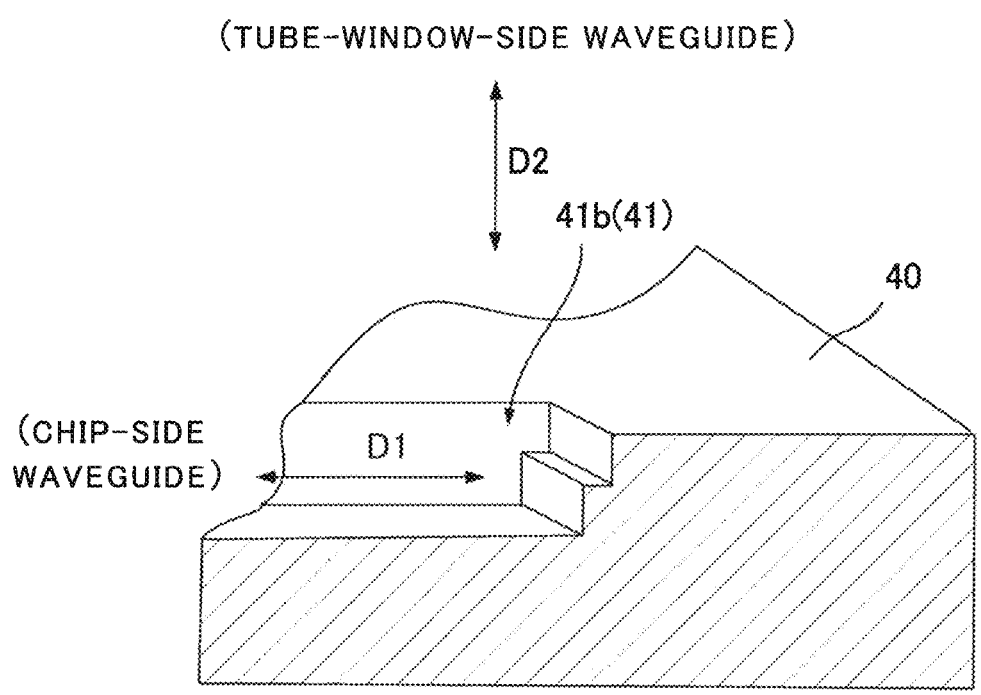
FIG. 6 is a partial cross-sectional view of a conductor cover.

The conductor cover 40 also in (FIG. 1 and FIG. 2) includes an interface hole 41 also in (FIG. 2) which forms an interface with respect to the waveguide tube. FIG. 6 is a cross-sectional view of a portion B-B of the conductor cover 40 in FIG. 2. FIG. 7 is a partial cross-sectional view of the millimeter wave semiconductor apparatus 2.

Figure 8:
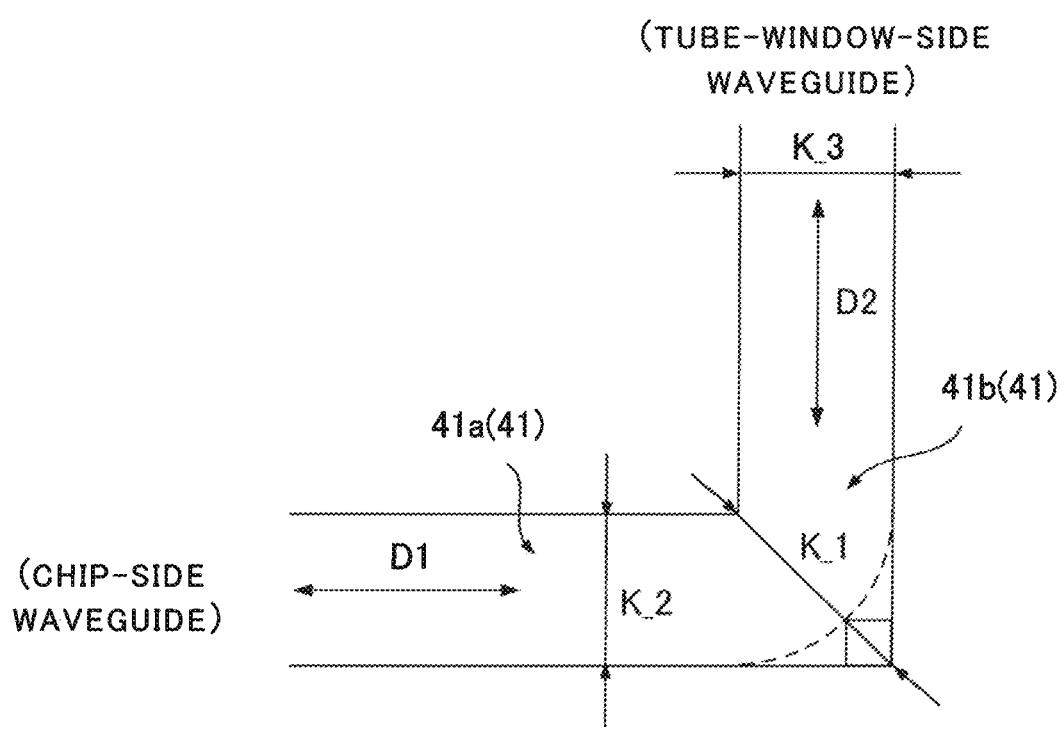
FIG. 8 is a drawing for explaining a shape of a bent portion.

The interface hole 41 includes a straight portion 41a also in (FIG. 7 and FIG. 8) forming a waveguide (chip-side waveguide)in FIGS. 6 and 8 in a direction of the millimeter wave semiconductor chip 3 (chip direction) D1 also in (FIG. 6 and FIG. 8), and a bent portion 41b forming a waveguide (tube window side waveguide) in FIGS. 6 and 8 in a direction of the waveguide tube window 11 illustrated in FIG. 7 (tube window direction) D2 also in (FIG. 6 and FIG. 8).

The bent portion 41b illustrated in FIG. 6 is formed into a staircase shape. The reason why such a shape is employed will be described with reference to FIG. 8. A case where the RF signal is transmitted from the chip-side waveguide toward the tube window side waveguide will be considered in FIG. 8. At this time, a direction of travel is changed at a corner of the waveguide, and a waveguide thickness K_1 at the corner is larger than a waveguide thickness K_2 on the chip-side waveguide and a waveguide thickness K_3 on the tube window side waveguide. As this change in thickness of the waveguide may lower wave-guiding characteristics, and thus the bent portion 41b is formed into the staircase shape as illustrated in FIG. 6.

Note that the reason why the staircase shape is employed is because the interface hole 41 is formed by machining with an end mill and, for example, a ball end mill or a cast molding may realize formation of a predetermined curvature.

Figure 9:
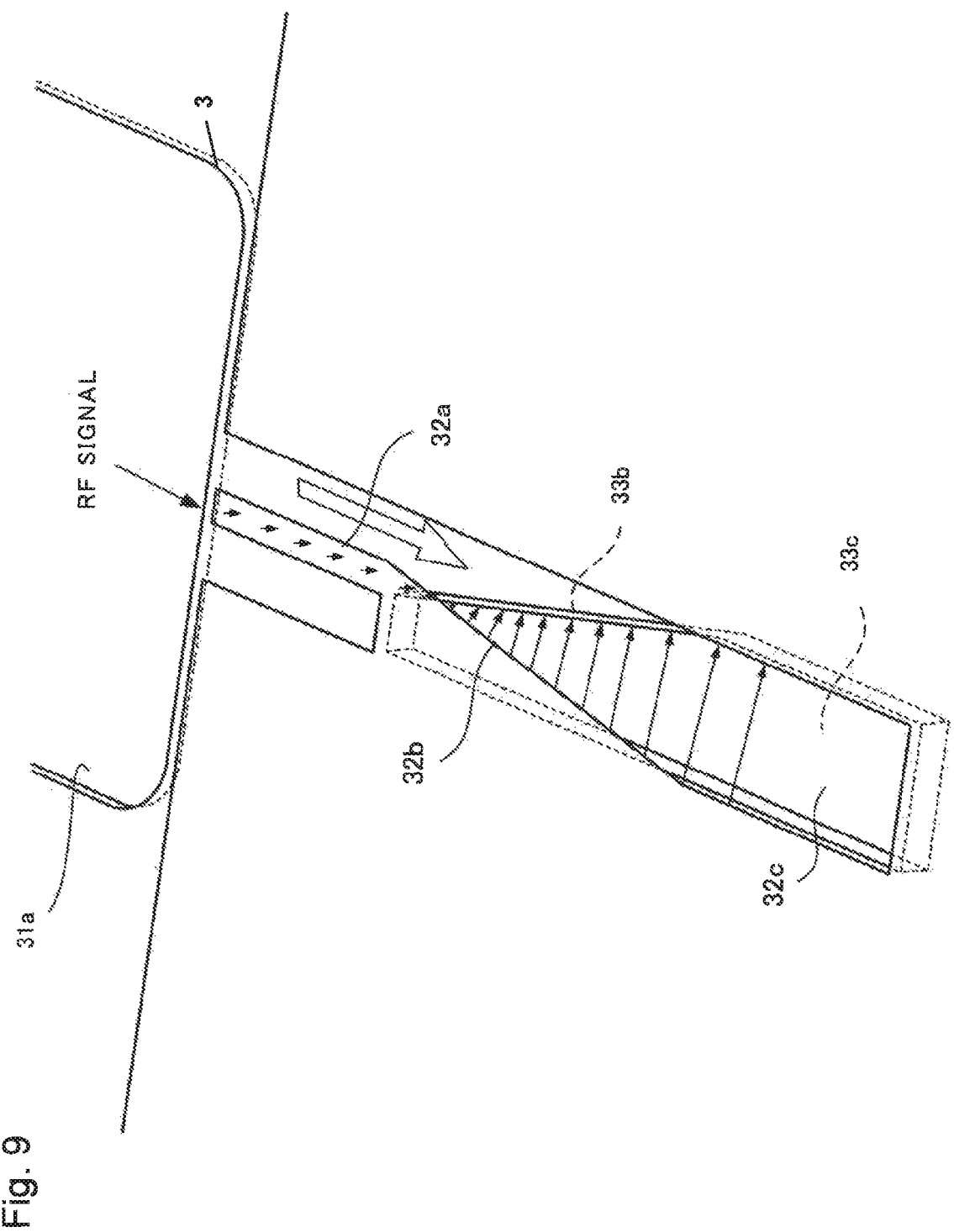
FIG. 9 is a drawing illustrating how an electric field of an RF signal is transmitted.
Figure 10:
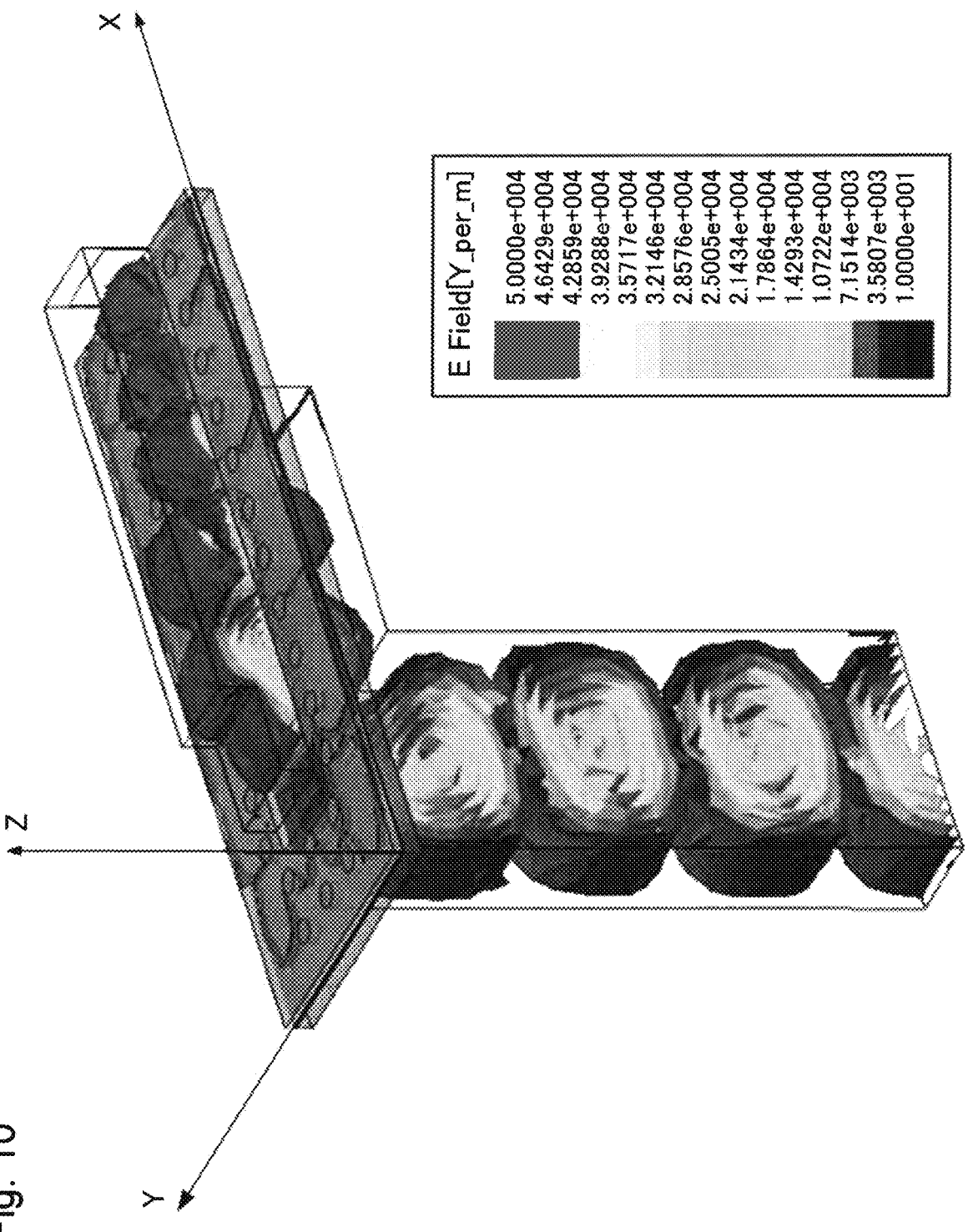
Fig. 10 is a result of simulation illustrating a distribution of an intensity of the RF signal being transmitted through a waveguide tube.
Figure 11:
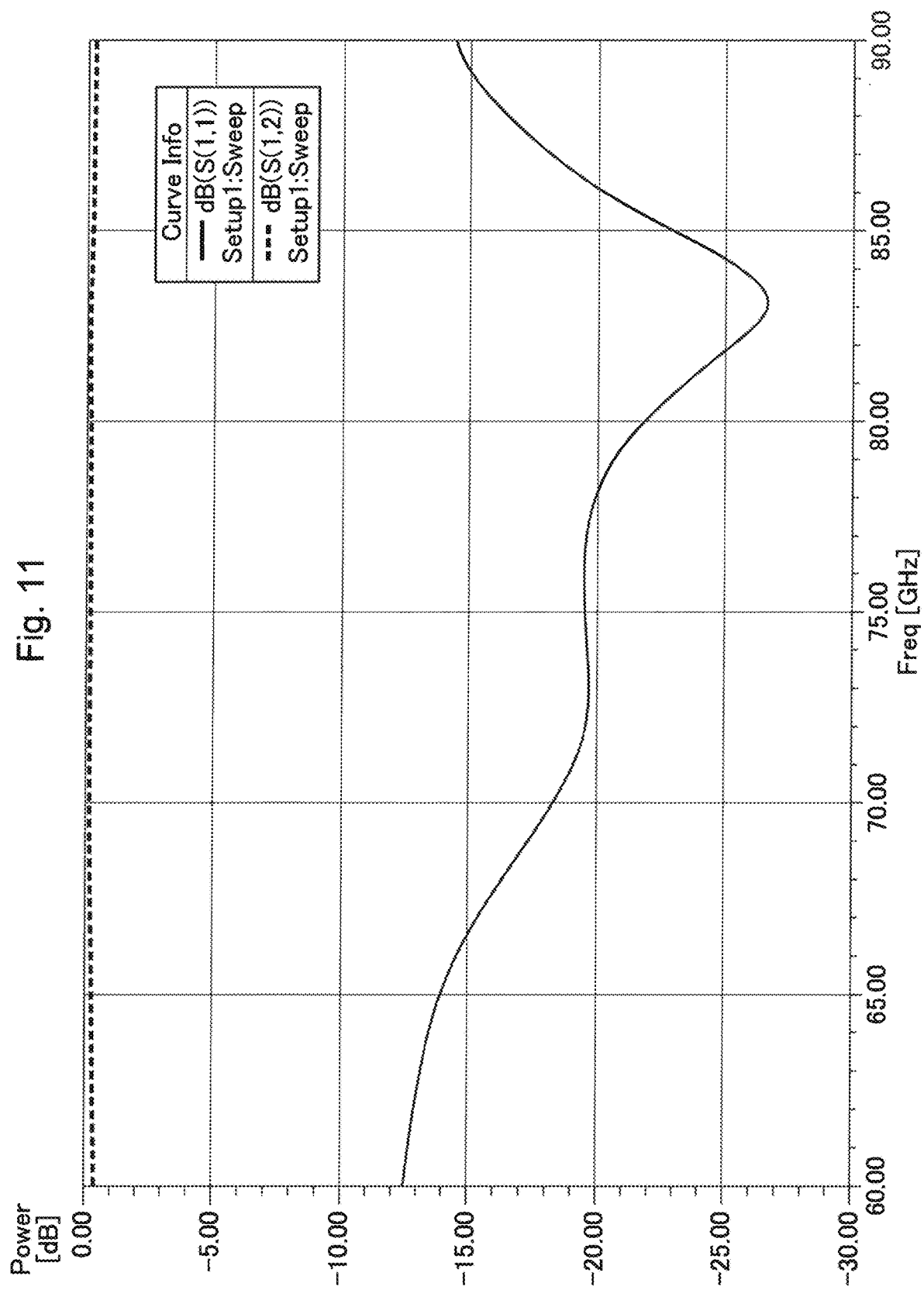
FIG. 11 is a drawing illustrating a return loss (solid line) and a transmission loss (dotted line).

In this configuration, an electric field of the RF signal is transmitted as illustrated in FIG. 9. Note that arrows in FIG. 9 indicate the electric field of the RF signal transmitted from the millimeter wave semiconductor chip 3 also in (FIG. 1, FIG. 2, and FIG. 5) via the microstrip line portion 32a, and a hollow arrow indicates a direction of transmission. FIG. 10 is a result of simulation illustrating (using X, Y, and Z axes and a legend box showing E Field[Y per m]) an intensity distribution of the RF signal transmitting through the waveguide tube. The intensity distribution of the electric field of the RF signal changes periodically along the waveguide. FIG. 11 is a drawing illustrating a return loss S(1,1) in dB (solid line) and a transmission loss S(1,2) in (dotted line), the X axis showing Freq [GHz] and the Y axis showing Power [dB].

It is understood that the waveguide tube including the waveguide tube window 11, the waveguide 21, and the interface hole 41 has a desirable guiding characteristics with respect to the RF signal. By a calculation assuming a waveguide tube having an E-band, sufficient characteristics as the RF interface of the package are achieved in a broadband from 60 to 90 GHz.

Figure 12:
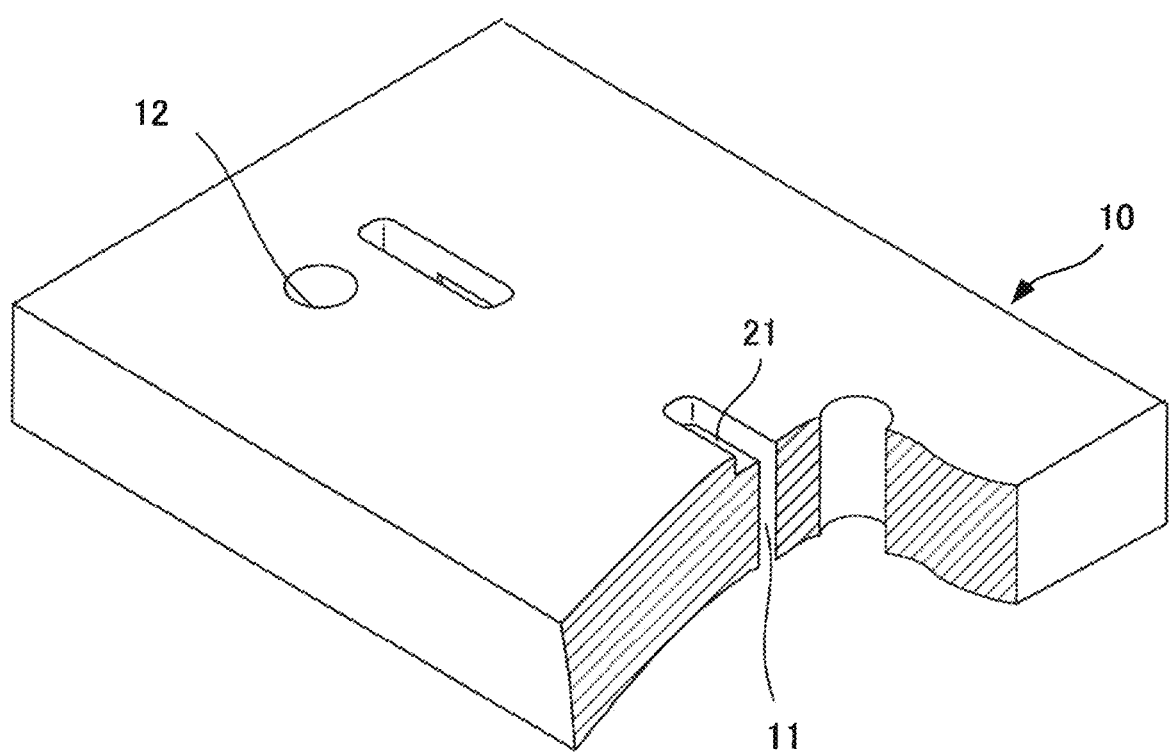
FIG. 12 is a partially broken cross-sectional view when a waveguide is formed at a waveguide tube window.
Figure 13:
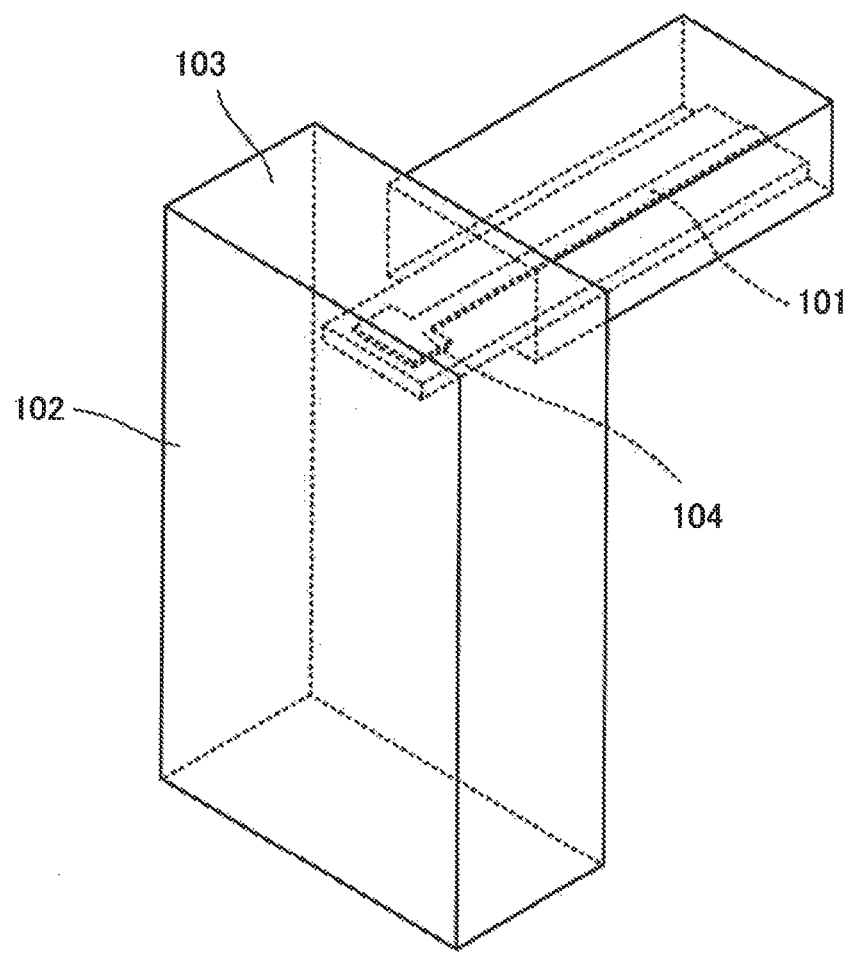
FIG. 13 is a perspective view of the millimeter wave semiconductor apparatus applied to a description of the related art.
Figure 14:
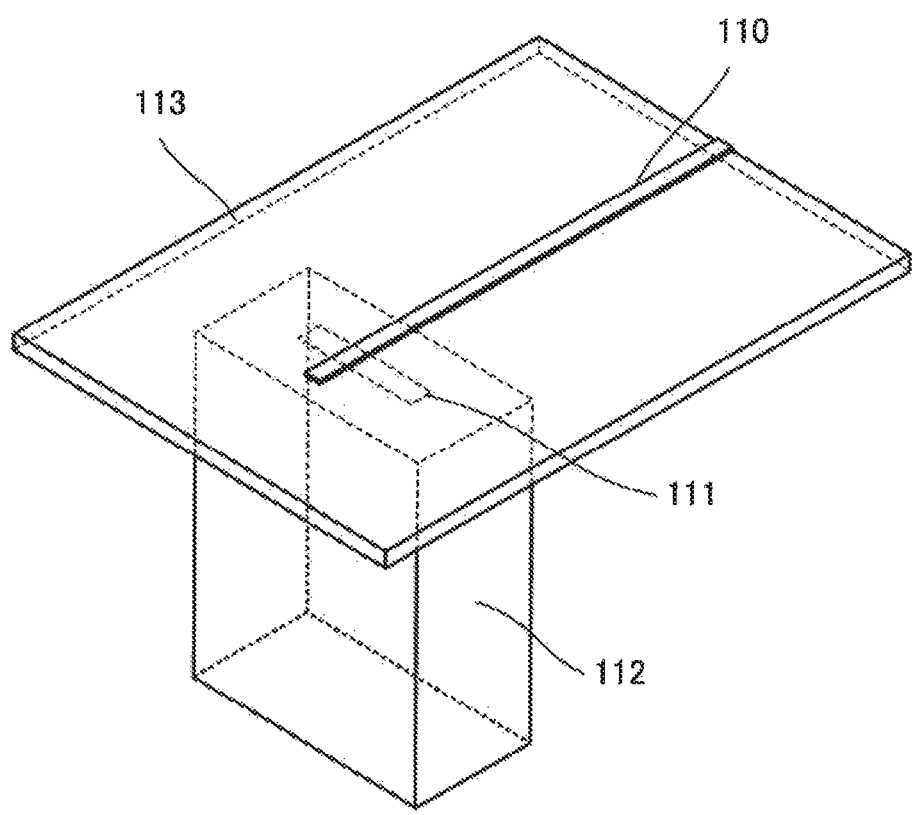
FIG. 14 is a perspective view of the millimeter wave semiconductor apparatus having another configuration to be applied to the description of the related art.

Note that in the above description, the waveguide 21 is formed on the mounting substrate 20 However, the invention is not limited to this configuration. In another possible configuration, for example, the waveguide 21 may be formed in the waveguide tube window 11 of the conductor case 10 as illustrated in FIG. 12. Alternatively, a configuration in which the module substrate 30, the mounting substrate 20, and the like are fastened with the screws from the conductor cover 40 have been described in FIG. 2, integration is achieved with other methods such as soldering. In this case, as irregularity of the surface is eliminated, and thus surface mount is enabled.

The present invention has been described with the above-described exemplary embodiment as a model example thus far. However, the present invention is not limited to the embodiment described above. In other words, the present invention may take various modes understood by those skilled in the art without departing from the scope of the present invention.

REFERENCE SIGNS LIST 2 millimeter wave semiconductor apparatus
3 millimeter wave semiconductor chip
10 conductor case
11 waveguide tube window
20 mounting substrate
21 waveguide
30 module substrate
31 base member
31a cavity
32 line pattern
32a microstrip line portion
32b fin line portion
32c interface portion
33 ground pattern
33b fin line portion
33c interface portion
40 conductor cover
41 interface hole
41a straight portion
41b bent portion

The invention claimed is:

1. A millimeter wave semiconductor apparatus including a package of a millimeter wave semiconductor chip and a waveguide tube configured to guide an RF signal entering and exiting the millimeter wave semiconductor chip, the apparatus comprising:
    a module substrate including the millimeter wave semiconductor chip mounted thereon; and
    a waveguide tube member included in the package,
    wherein the waveguide: tube member comprises the waveguide tube,
    wherein the waveguide tube member supports the module substrate,
    wherein the module substrate includes:
        a base member;

a line pattern including a microstrip line portion, a fin line portion, and an interface portion formed on one surface of the base member;

a ground pattern formed on the other surface of the base member; and a cavity defined by a hole formed through the base member at a center portion thereof and a surface of the ground pattern on a side where the line pattern is formed as a bottom surface for mounting the millimeter wave semiconductor chip on the bottom surface thereof, wherein the microstrip line portion and the millimeter wave semiconductor chip are wire-bonded at the substantially same level.

2. The millimeter wave semiconductor apparatus according to claim 1, wherein the waveguide tube member includes:

a conductor cover forming a chip-side waveguide by covering the microstrip line portion, the fin line portion, and the interface portion; and a case member having a tube window side waveguide formed at a position corresponding to the interface portion, wherein the tube window side waveguide is a part of the waveguide tube member, and the module substrate is held between the conductor cover and the case member.

3. The millimeter wave semiconductor apparatus according to claim 2, wherein the case member includes:

a conductor case provided with a waveguide tube window formed thereon; and a mounting substrate forming the tube window side waveguide by communicating the waveguide tube window with the interface portion, wherein the mounting substrate, the module substrate, and the conductor cover are disposed on the conductor case.

4. The millimeter wave semiconductor apparatus according to claim 2, wherein the case member includes:

a conductor case including a waveguide tube window and the tube window side waveguide formed by communicating the waveguide tube window with the interface portion formed in a conductor case hole formed in the conductor case, and wherein the module substrate and the conductor cover are disposed on the conductor case.

5. The millimeter wave semiconductor apparatus according to claim 2, wherein the chip-side waveguide includes:

a straight portion making travel of the RF signal straight ahead and a bent portion changing the direction of travel, and wherein the waveguide thickness at the bent portion is formed to be constant.

* * * * *

UNITED STATES PATENT AND TRADEMARK OFFICE
CERTIFICATE OF CORRECTION

PATENT NO. : 10,615,481 B2
APPLICATION NO. : 15/753998
DATED : April 7, 2020
INVENTOR(S) : Toshihide Kuwabara It is certified that error appears in the above-identified patent and that said Letters Patent is hereby corrected as shown below:

In the Specification

Column 6, Detailed Description of the Embodiments, Line 1; After "S(1,2) in", insert --dB--

In the Claims

Column 6, Line 62; In Claim 1, delete "waveguide:" and insert --waveguide-- therefor Signed and Sealed this
Fourteenth Day of July, 2020

Andrei Iancu
*Director of the United States Patent and Trademark Office*